(12) United States Patent
Igarashi et al.

(10) Patent No.: US 9,620,353 B2
(45) Date of Patent: Apr. 11, 2017

(54) METHOD OF MANUFACTURING SEMICONDUCTOR DEVICE

(71) Applicant: KABUSHIKI KAISHA TOSHIBA, Minato-ku (JP)

(72) Inventors: Junichi Igarashi, Nagoya (JP); Katsuhiro Sato, Yokohama (JP); Masaaki Hirakawa, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 189 days.

(21) Appl. No.: 14/554,445

(22) Filed: Nov. 26, 2014

(65) Prior Publication Data

US 2015/0155159 A1    Jun. 4, 2015

(30) Foreign Application Priority Data

Nov. 29, 2013 (JP) .................. 2013-248099

(51) Int. Cl.
*H01L 21/302* (2006.01)
*H01L 21/02* (2006.01)

(52) U.S. Cl.
CPC .............. *H01L 21/02057* (2013.01)

(58) Field of Classification Search
CPC ......... H01L 21/67028; H01L 21/02058; H01L 21/67034; C11D 11/0047; C23C 16/4405
USPC ............................................ 510/175; 134/10
See application file for complete search history.

(56) References Cited

U.S. PATENT DOCUMENTS

2013/0008868 A1*    1/2013  Uozumi ................. G03F 7/162
                                                             216/41

FOREIGN PATENT DOCUMENTS

| JP | 9-190996 | 7/1997 |
|----|----------|--------|
| JP | 10-135180 | 5/1998 |
| JP | 11-294948 | 10/1999 |
| JP | 2008-10638 | 1/2008 |
| JP | 2008-130685 | 6/2008 |
| JP | 2012-243869 A | 12/2012 |
| JP | 2013-16699 | 1/2013 |
| JP | 2013-33817 | 2/2013 |
| JP | 2013-42093 | 2/2013 |
| JP | 201342094 A | 2/2013 |
| JP | 2013-258272 | 12/2013 |

* cited by examiner

*Primary Examiner* — Gregory Webb
(74) *Attorney, Agent, or Firm* — Oblon, McClelland, Maier & Neustadt, L.L.P.

(57) ABSTRACT

A method of manufacturing a semiconductor device including attaching, by a liquid treatment, a first liquid to a surface of a semiconductor substrate having a fine pattern formed therein; substituting the first liquid attached to the surface of the semiconductor substrate with a solution, the solution comprising a sublimate dissolved in a second liquid; vaporizing the second liquid and precipitating the sublimate to the surface of the semiconductor substrate to form a solid precipitate comprising the sublimate; and removing the precipitate by sublimation. For example, the sublimate may be a material having at least two carboxyl groups bonded to cyclohexane or a material formed of two carboxyl groups bonded to benzene with the bonding sites of the two carboxyl groups being adjacent to one another.

20 Claims, 11 Drawing Sheets

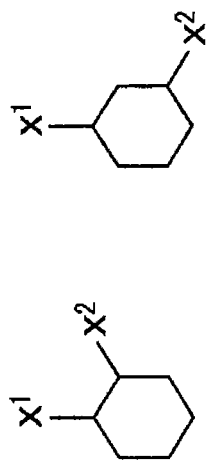
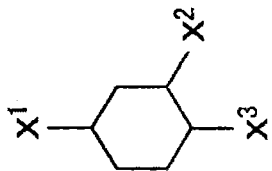
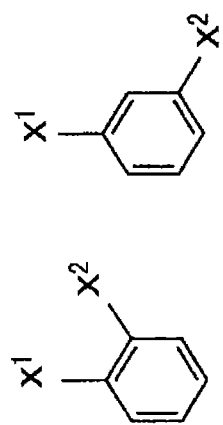
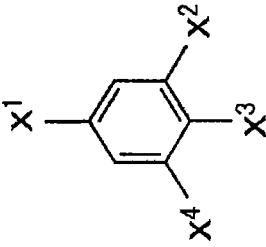
FORMULA A1 FIG.5A    FORMULA A2 FIG.5B    FORMULA A3 FIG.5C    FORMULA A4 FIG.5D
FORMULA B1 FIG.6A    FORMULA B2 FIG.6B    FORMULA B3 FIG.6C    FORMULA B4 FIG.6D    FORMULA B5 FIG.6E

FORMULA C1
FIG. 7A
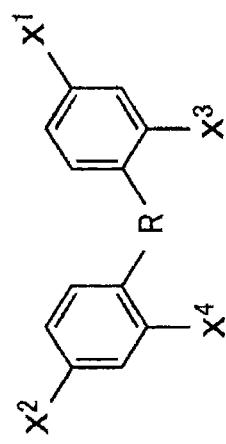
FORMULA C2
FIG. 7B
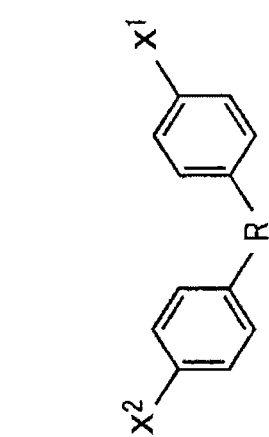
FORMULA D1
FIG. 8A
FORMULA D2
FIG. 8B

| STRUCTURAL FORMULA | NAME |
|---|---|
| 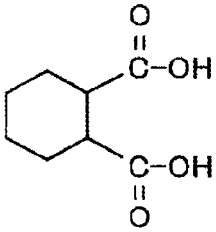 | CYCLOHEXANE-1, 2-DICARBOXYLIC ACID |
| 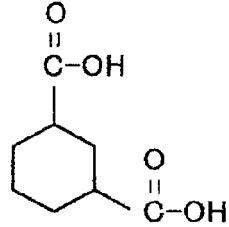 | CYCLOHEXANE-1, 3-DICARBOXYLIC ACID |
| 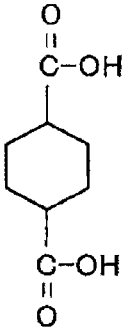 | CYCLOHEXANE-1, 4-DICARBOXYLIC ACID |
| 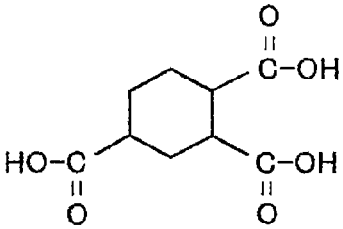 | CYCLOHEXANE-1, 2, 4-TRICARBOXYLIC ACID |
FIG.9

| STRUCTURAL FORMULA | NAME |
|---|---|
| 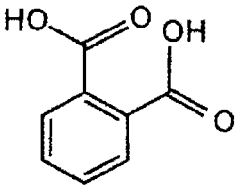 | PHTHALIC ACID |
| 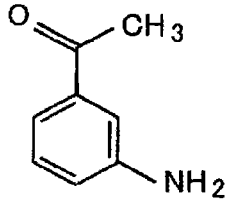 | AMINOACETPHENONE |
FIG.10

| STRUCTURAL FORMULA | NAME |
|---|---|
| 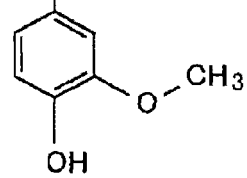 | BARININ |
| 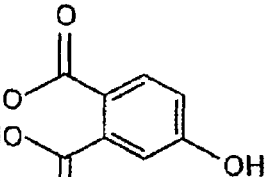 | 4-HYDROXYPHTHALIC ACID |
| 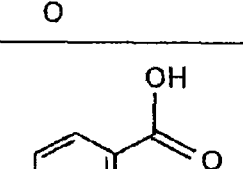 | TRIMELLITIC ACID |
| 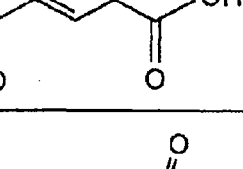 | TRIMELLTIC ANHYDRIDE |
| 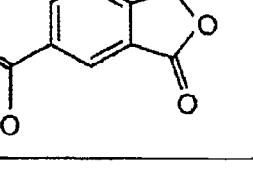 | DIMETHOXYACETPHENONE |
FIG.11

| STRUCTURAL FORMULA | NAME |
|---|---|
| 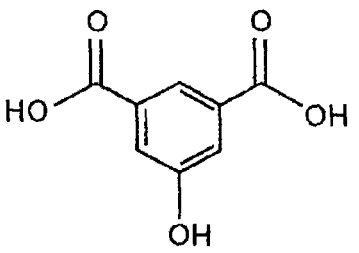 | 5-HYDROXYISOPHTHALIC ACID |
FIG.12
| STRUCTURAL FORMULA | NAME |
|---|---|
| 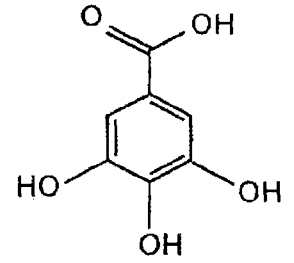 | GALLIC ACID |
| 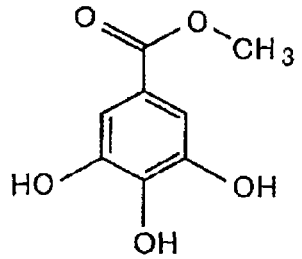 | GALLIC ACID METHYL |
FIG.13

| STRUCTURAL FORMULA | NAME |
|---|---|
| 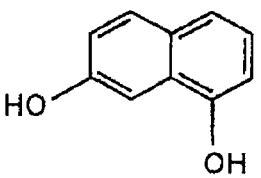 | 1, 7-DIHYDRONAPHTHALENE |
FIG.14
| STRUCTURAL FORMULA | NAME |
|---|---|
| 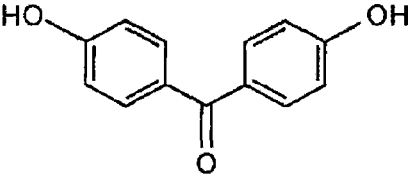 | 4, 4'-DIHYDROXYBENZOPHENONE |
| 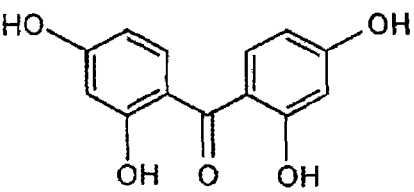 | 2,2', 4,4'-TETRAHYDROXYBENZOPHENONE |
FIG.15

METHOD OF MANUFACTURING SEMICONDUCTOR DEVICE

CROSS-REFERENCE TO RELATED APPLICATION(S)

This application is based upon and claims the benefit of priority from Japanese Patent Application No. 2013-248099, filed on, Nov. 29, 2013 the entire contents of which are incorporated herein by reference.

FIELD

Embodiments disclosed herein generally relate to a method of manufacturing a semiconductor device.

BACKGROUND

During a manufacturing process flow of a semiconductor device in which miniature structures are formed, a semiconductor substrate (workpiece) may be subjected to liquid treatments using liquids such as a cleaning liquid. When drying the surface of the semiconductor substrate after the liquid treatment, the miniature structures formed in the semiconductor substrate may collapse by the surface tension exerted by the liquid attached to the surface of the semiconductor substrate. Pattern collapse is prone to occur especially when drying semiconductor substrates having shrunk and high-aspect-ratio patterns.

BRIEF DESCRIPTION OF THE DRAWINGS

FIGS. 5A, 5B, 5C, 5D, 6A, 6B, 6C, 6D, and 6E each represent a chemical formula of a material of the present embodiment.

FIGS. 7A and 7B each represent a chemical formula of a material of the present embodiment.

FIGS. 8A and 8B each represent a chemical formula of a material of the present embodiment.

FIGS. 9 to 15 are tables exemplifying the chemical formulae of the materials of the present embodiment.

DESCRIPTION

Figure 1:
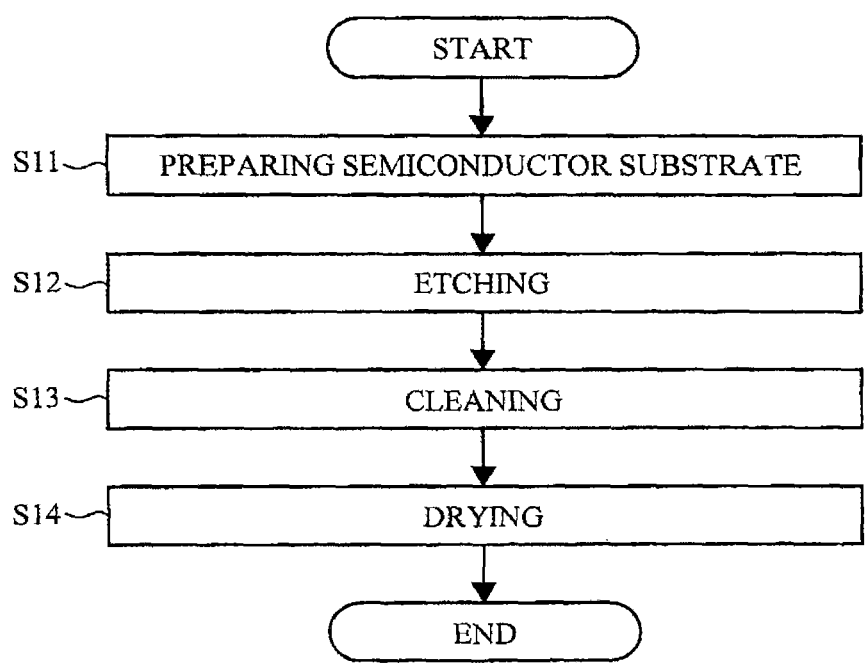
FIG. 1 is a flowchart indicating one example of an embodiment of a manufacturing process flow of a semiconductor device.

In one embodiment, a method of manufacturing a semiconductor device includes attaching, by a liquid treatment, a first liquid to a surface of a semiconductor substrate having a fine pattern formed therein; substituting the first liquid attached to the surface of the semiconductor substrate with a solution, the solution comprising a sublimate dissolved in a second liquid; vaporizing the second liquid and precipitating the sublimate to the surface of the semiconductor substrate to form a solid precipitate comprising the sublimate; and removing the precipitate by sublimation. The sublimate comprises at least one material selected from a group consisting of: materials represented by chemical formulae A1, A2, A3, and A4 indicated in FIG. 5A, FIG. 5B, FIG. 5C, and FIG. 5D where $X^1$, $X^2$, and $X^3$ in the chemical formulae A1, A2, A3, and A4 each independently represent either of a hydroxy group (—OH), a carboxyl group (—COOH), an amino group (—NH$_2$), an amide group (—CONH$_2$), a nitro group (—NO$_2$), and a methylester group (—COO—CH$_3$), materials represented by chemical formulae B1, B2, B3, B4, and B5 indicated in FIG. 6A, FIG. 6B, FIG. 6C, FIG. 6D, and FIG. 6E where $x^1$, $X^2$, $X^3$, and $X^4$ in the chemical formulae B1, B2, B3, B4 and B5 each independently represent either of a hydroxy group (—OH), a carboxyl group (—COOH), an amino group (—NH$_2$), an amide group (—CONH$_2$), a nitro group (—NO$_2$), a methylester group (—COO—CH$_3$), a methoxy group (—OCH$_3$), an ethoxy group (—OCH$_2$CH$_3$), and a propoxy group (—OCH$_2$CH$_2$CH$_3$), materials represented by chemical formulae C1 and C2 indicated in FIG. 7A and FIG. 7B where $X^1$ and $X^2$ in the chemical formulae C1 and C2 each independently represent either of a hydroxy group (—OH), a carboxyl group (—COOH), an amino group (—NH$_2$), an amide group (—CONH$_2$), a nitro group (—NO$_2$), a methylester group (—COO—CH$_3$), a methoxy group (—OCH$_3$), an ethoxy group (—OCH$_2$CH$_3$), and a propoxy group (—OCH$_2$CH$_2$CH$_3$), and materials represented by chemical formulae D1 and D2 indicated in FIG. 8A and FIG. 8B where $X^1$, $X^2$, $X^3$, and $X^4$ in the chemical formulae D1 and D2 each independently represent either of a hydroxy group (—OH), a carboxyl group (—COOH), an amino group (—NH$_2$), an amide group (—CONH$_2$), a nitro group (—NO$_2$), a methylester group (—COO—CH$_3$), a methoxy group (—OCH$_3$), an ethoxy group (—OCH$_2$CH$_3$), and a propoxy group (—OCH$_2$CH$_2$CH$_3$) and where R in the chemical formulae D1 and D2 represent either of a carbonyl group (—CO—), a peptide bond (—CONH—), an ester bond (—COO—), an ether bond (—O—), (—NHNHO—) bond, (—COCOO—) bond, and a (—CHCH—) bond.

Embodiment

An embodiment is described herein with reference to the accompanying drawings. The drawings are schematic and are not necessarily consistent with the actual relation between thickness and planar dimensions as well as the ratio of thicknesses between different layers, etc. The same portion may be illustrated in different dimensions or ratios in different figures. Further, directional terms such as up, down, left, and right are used in a relative context with an assumption that the surface, on which circuitry is formed, of the later described semiconductor substrate faces up and thus, do not necessarily correspond to the directions based on gravitational acceleration. Elements once described in the specification and illustrated in the drawings or similar to those once described and illustrated are thereafter identified with identical reference symbols and may not be re-described.

A description will be given hereinafter on the present embodiment with reference to FIG. 1 to FIG. 4 (FIG. 4A to FIG. 4D).

FIG. 1 is a flowchart indicating one example of a manufacturing process flow of a semiconductor device of the present embodiment. FIG. 2A to FIG. 2D illustrate one example of a manufacturing process flow of the semiconductor device of the present embodiment. More specifically, FIG. 2A to FIG. 2D are vertical cross-sectional views each schematically illustrating one phase of the manufacturing process flow of the semiconductor device of the present embodiment. FIG. 3 is a flowchart indicating, in particular, one example of a drying process in the manufacturing process flow of the semiconductor device of the present embodiment. FIG. 4A to FIG. 4D illustrate in detail the drying step in the manufacturing process flow of the semiconductor device of the present embodiment. More specifically, FIG. 4A to FIG. 4D are vertical cross-sectional views each schematically illustrating one phase of the drying process flow for drying the structure being manufactured.

Figure 2A:
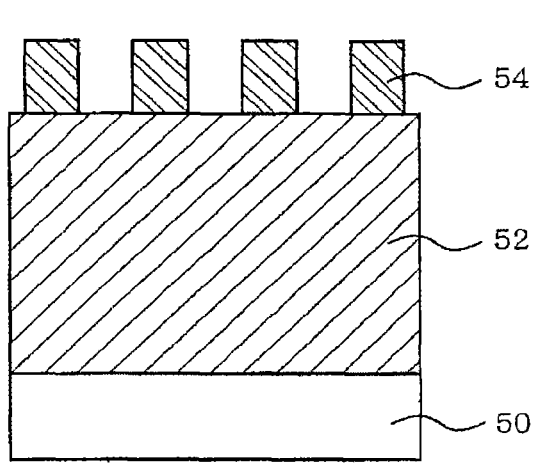
FIGS. 2A to 2D are vertical cross-sectional views each schematically illustrating one phase of the manufacturing process flow of the semiconductor device of the present embodiment.
Figure 3:
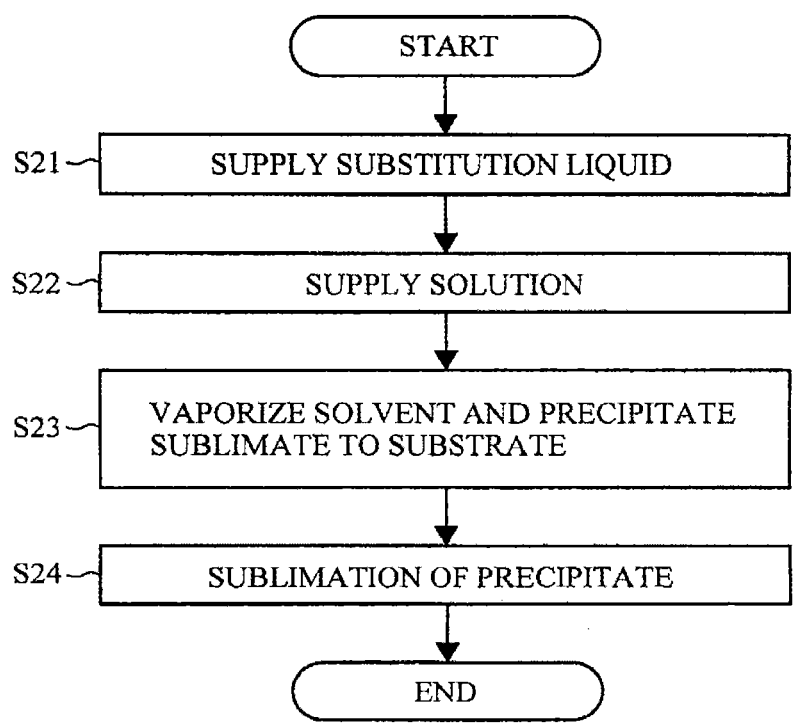
FIG. 3 is a flowchart indicating one example of a drying process in detail.

First, semiconductor substrate 50 is prepared (S11) as illustrated in FIG. 1 and FIG. 2A. A silicon substrate, an SOI (silicon on insulator) substrate, an SiC substrate, a substrate formed of two or more components including a silicon element, a sapphire substrate, a compound substrate, a plastic substrate, a glass substrate, or other various types of substrates for example may be used as semiconductor substrate 50. Semiconductor substrate 50 may have various types of insulating films, conductor films, or the stack of the foregoing films formed above its surface. Semiconductor substrate 50 may have a structure comprising various types of insulating films, electrically conductive films, or the stack of the foregoing films formed above its surface. The surface of such structure formed above semiconductor substrate 50 may be covered by an insulating film.

Etch target film 52 is formed above semiconductor substrate 50. Etch target film 52 is formed of an insulating film for example. A silicon oxide film may be used for example as an insulating film. Various types of organic materials, inorganic materials, insulating films, conductor films, or a stack of the forgoing or the like may be used as etch target film 52.

Examples of etch target film 52 include silicon-based material such as a silicon oxide, a silicon nitride, a polycrystalline silicon, and monocrystalline silicon; metal-based material such as titanium nitride, tungsten, ruthenium, tantalum nitride, and tin; or a combination of the foregoing.

Etch target film 52 may be a film structure used for example in a memory gate of a NAND-type nonvolatile semiconductor storage device. For example, etch target film 52 may be a stack of films including for example a gate insulating film (such as a silicon oxide film), a first polysilicon film, a silicon oxynitride film, a second polysilicon film, a barrier metal film (such as a tungsten nitride film or the like), a metal film (such as tungsten), a cap insulating film (such as a silicon nitride film).

Etch mask 54 is formed above etch target film 52. A patterned resist film, formed by lithography for example, may be used as etch mask 54. Instead of the resist film, a hard mask made of materials such as a silicon oxide film, silicon nitride film, a polysilicon, carbon, or the like may be used as etch mask 54. The hard mask may be formed for example by patterning the foregoing materials by lithography and RIE (Reactive Ion Etching). Further, etch mask 54 may be formed for example by a sidewall transfer technique in which fine patterns are formed using sidewall patterns formed along side surfaces of mandrels.

Etch mask 54 is formed using a material having etch selectivity with respect to etch target film. Etch mask 54 is formed for example into a line-and-space pattern extending in the front and rear direction (first direction) as viewed in FIG. 2A in which the lines each have a predetermined width and a predetermined spacing from one another in the left and right direction (second direction orthogonal to the first direction). Etch mask 54 may further be patterned for example into a hole pattern or a pillar pattern as in a cylinder-type capacitor pattern of a DRAM (Dynamic Random Access Memory).

Figure 2B:
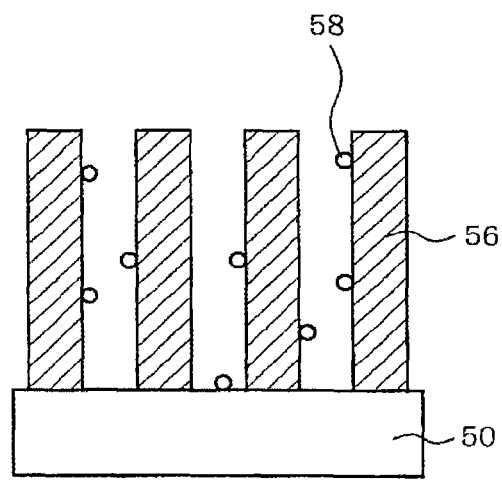

Next, as illustrated in FIG. 1 and FIG. 2B, etch target film 52 is etched (S12) using etch mask 54 as a mask. The etching may be carried out by dry etching such as RIE. Wet etching may be carried out instead of etching. The present embodiment discloses an example in which RIE dry etching is used. Anisotropic conditions or isotropic conditions may be used in the RIE dry etching. The present embodiment discloses an example in which anisotropic conditions are used.

The etching etches the etch target film 52 using etch mask 54 as a mask. The etching transfers the shape of etch mask 54 to etch target film 52 and forms structure 56. Structure 56 is formed for example into a line-and-space pattern extending in the front and rear direction (first direction) as viewed in FIG. 2B in which the lines each have a predetermined width and a predetermined spacing from one another in the left and right direction (second direction orthogonal to the first direction).

Next, etch mask 54 is removed. The surfaces of semiconductor substrate 50 and structure 56 may have foreign materials 58 such as impurities, etch residues, deposits, and particles. Such foreign materials 58 may come in the form of inorganic materials, organic materials, metals, or the like.

Figure 2C:
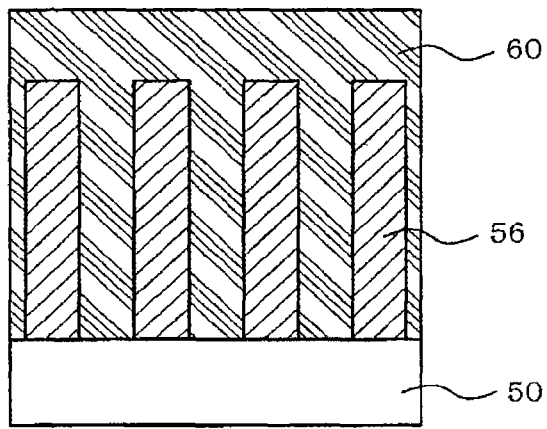

Next, as illustrated in FIG. 1 and FIG. 2C, the etched semiconductor substrate 50 is cleaned (S13). Various types of cleaning solutions may be used in the cleaning. SPM (Sulfuric Acid Hydrogen Peroxide Mixture), APM (Ammonium Hydrogen Peroxide Mixture), HPM (Hydrochloric Acid Hydrogen Peroxide Mixture), and DHF (Diluted Hydrofluoric Acid), and the like are examples of such cleaning solutions. Foreign materials 58 including organic materials, metal, particles, and the like may be removed by the cleaning.

Cleaning may be carried out by immersion cleaning in which semiconductor substrate 50 is immersed in a bath of cleaning solution 60 or spin cleaning in which cleaning solution 60 is supplied to the surface of a rotating semiconductor substrate 50 placed on a spinning apparatus, or the like. Cleaning solution 60 adheres to the surface of semiconductor substrate 50 as the result of the above described cleaning process.

Figure 2D:
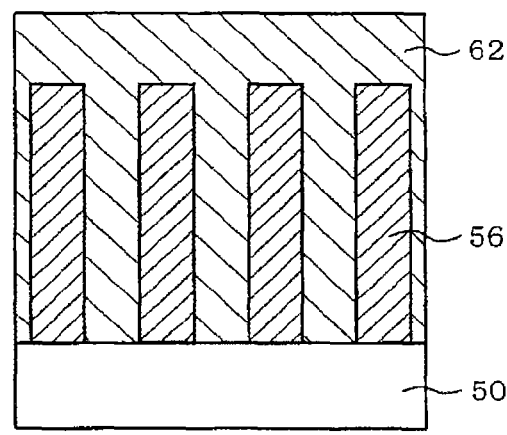

Next, as illustrated in FIG. 1 and FIG. 2D, the surface of semiconductor substrate 50 is rinsed using rinse liquid 62. Deionized water (DIW) may be used for example as rinse liquid 62. Cleaning solution 60 adhered to semiconductor substrate 50 can be removed in the rinse process by substituting cleaning solution 60 with rinse liquid 62. The rinsing using rinse liquid 62 may be carried out by immersion rinsing in which semiconductor substrate 50 is immersed in a bath of rinse liquid 62 or spin rinsing in which rinse liquid 62 is supplied to the surface of a rotating semiconductor substrate 50 placed on a spinning apparatus, or the like.

The spaces between adjacent structures 56 formed in the surface of semiconductor substrate 50 are filled with cleaning solution 60 or rinse liquid 62 throughout the cleaning process and the rinsing process, and the drying process described hereinafter is carried out in such state.

Next, semiconductor substrate 50 is dried (S14) as illustrated in FIG. 1. The sequence of the drying step is detailed in FIG. 3 and FIG. 4A to FIG. 4D. The drying step carried out in the process flow for manufacturing the semiconductor device of the present embodiment will be described in detail hereinafter with reference to FIG. 3 and FIG. 4A to FIG. 4D.

Figure 4A:
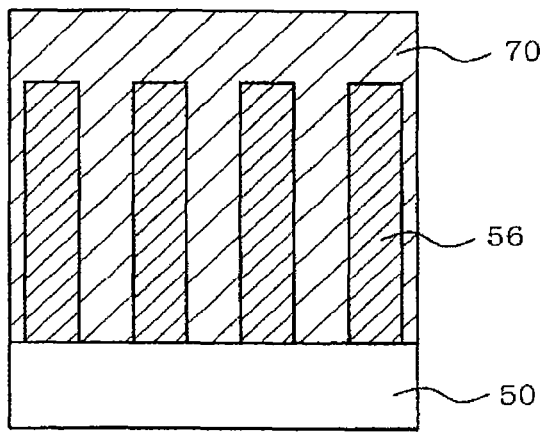
FIGS. 4A to 4D are vertical cross-sectional views each schematically illustrating one phase of the drying process flow for drying the structures being manufactured.

First, as illustrated in FIG. 3 and FIG. 4A, substitution liquid 70 is supplied (S21) to semiconductor substrate 50 in which at least rinse liquid 62 is filled in the spaces between structures 56 formed in the surface of semiconductor substrate 50. A liquid capable of substituting rinse liquid 62 may be used as substitution liquid 70. A liquid having affinity for rinse liquid 62 (such as pure water), that is, a liquid capable of forming a mixture with rinse liquid 62 without separating, etc. from rinse liquid 62 may be used as substitution liquid 70.

A liquid capable of being substituted with the later described solution 72 may be used as substitution liquid 70. A liquid having affinity for solution 72, that is, a liquid capable of forming a mixture with solution 72 without separating from solution 72 may be used as substitution liquid 70.

Substitution liquid 70 and the solvent used in solution 72 containing the later described sublimate (sublimating material) 74 preferably have affinity for one another. Substitute liquid 70 and the solvent used in solution 72 may be the same or different. Rinse liquid 62 and the solvent used in solution 72 preferably have affinity for one another. Rinse liquid 62 and the solvent used in solution 72 may be the same or different.

Materials such as aliphatic hydrocarbon, aromatic hydrocarbon, esters, ketons, alcohols and ethers, polyalcohols, pyrrolidone solvent, amides, or a mixture of the foregoing may be used as substitution liquid 70. Thus, examples of substitution liquid 70 include: water, methanol, ethanol, IPA (isopropyl alcohol), butanol, ethylene glycol, propylene glycol, NMP (N-methyl-2-pyrrolidone), DMF (N,N-dimethyformamide), DMA (N, N-dimethylacetamide) and DMSO (dimethylsulfoxide), hexane, toluene, propyleneglycol monomethylether acetate (PGMEA), propyleneglycol monomethylether (PGME), propyleneglycol monopropylether (PGPE), propyleneglycol monoethylether (PGEE), gamma butyrolactone (GEL), acetylacetone, 3-pentanone, 2-pentanone, ethyl lactate, cyclohexanone, dibutylether, hydrofluoroethers (HFEs), ethyl nonafluoroisobutyl ether, ethyl nonafluorobutyl ether, m-xylenehexafluoride, cyclohexane, or a solvent containing a mixture of the foregoing.

The substitution process using substitution liquid 70 may be carried by, for example, by supplying substitution liquid 70 to the surface of a rotating semiconductor substrate 50 placed on a spinning apparatus.

The step of supplying substitution liquid 70 (S21) may be omitted. In such case, rinse liquid 62 is substituted by solution 72. Rinse liquid 62 and the solvent used in solution 72 preferably have affinity for one another. Rinse liquid 62 and the solvent used in solution 72 may be the same or different.

Figure 4B:
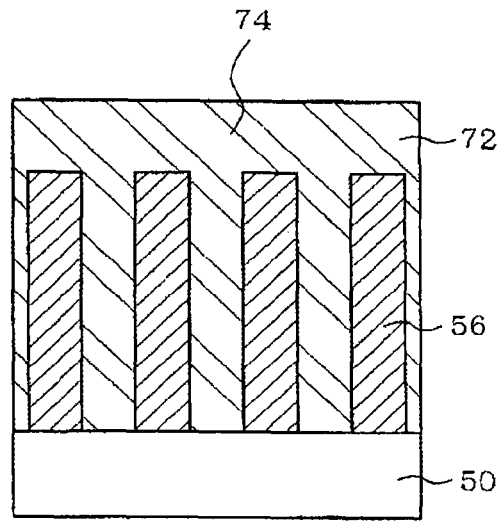

Next, as illustrated in FIG. 3 and FIG. 4B, solution 72 is supplied to semiconductor substrate 50 (S22). A liquid capable of substituting well with substitution liquid 70 may be used as solution 72. A liquid having affinity for substitution liquid 70 (such as IPA), that is, a liquid capable of mixing well with substitution liquid 70 without separating, etc. from substitution liquid 70 may be used as solution 72.

The substitution process using solution 72 may be carried by, for example, by supplying solution 72 to the surface of a rotating semiconductor substrate 50 placed on a spinning apparatus. Substitution liquid 70 is thus, substituted with solution 72.

Substitution liquid 70 and the solvent used in solution 72 preferably have affinity for one another. Substitution liquid 70 and the solvent used in solution 72 may be the same or different.

Materials such as aliphatic hydrocarbon, aromatic hydrocarbon, esters, ketons, alcohols and ethers, polyalcohols, pyrrolidone solvent, amides, or a mixture of the foregoing may be used as solution 72. Thus, examples of solution 72 include: water, methanol, ethanol, IPA (isopropyl alcohol), butanol, propanol, ethylene glycol, propylene glycol, NMP (N-methyl-2-pyrrolidone), DMF (N,N-dimethyformamide), DMA (N,N-dimethylacetamide) and DMSO (dimethylsulfoxide), hexane, toluene, propyleneglycol monomethylether acetate (PGMEA), propyleneglycol monomethylether (PGME), propyleneglycol monopropylether (PGPE), propyleneglycol monoethylether (PGEE), gamma butyrolactone (GEL), acetylacetone, 3-pentanone, 2-pentanone, ethyl lactate, cyclohexanone, dibutylether, hydrofluoroethers (HFEs), ethyl nonafluoroisobutyl ether, ethyl nonafluorobutyl ether, m-xylenehexafluoride, cyclohexane, formic acid, acetic acid, pyridine, diethylamine, dimethylamine, ethylenediamine, triethylamine, dimethylacetamide, diethylacetamide, formamide, or a solvent containing a mixture of the foregoing.

IPA, selected from the foregoing solvents for example, may be used as solution 72. Solution 72 contains sublimate 74 as a solute which is dissolved in a concentration ranging from 0.01 g/ml to 0.4 g/ml.

Examples of sublimates given in the present embodiment indicate organic materials having a vaporizing pressure of 5 Pa or less at room temperature and subliming from solid to gas by depressurization and/or heating (material having sublimating properties in depressurizing or heating conditions). Sublimate 74 may include materials expressed by the following generalized formulae A1, A2, A3, A4, B1, B2, B3, B4, B5, C1, C2, D1 and D2. Phthalic acid, trimellitic anhydride, cyclohexane-1,2-dicarboxylic acid, or the like may be used as sublimate 74.

(A) Materials represented by chemical formulae A1, A2, A3, and A4 indicated in FIG. 5A to FIG. 5D.

In chemical formulae A1, A2, A3, and A4, each of $X^1$, $X^2$ and $X^3$ independently indicate either of hydroxy group (—OH), carboxyl group (—COOH), amino group (—NH$_2$), amide group (—CONH$_2$), nitro group (—NO$_2$), and methylester group (—COO—CH$_3$).

(B) Materials represented by chemical formulae B1, B2, B3, B4, and B5 indicated in FIG. 6A to FIG. 6E.

In chemical formulae B1, B2, B3, B4, and B5, each of $X^1$, $X^2$, $X^3$, and $X^4$ independently indicate either of hydroxy group (—OH), carboxyl group (—COOH), amino group (—NH$_2$), amide group (—CONH$_2$), nitro group (—NO$_2$), methylester group (—COO—CH$_3$), methoxy group (—OCH$_3$), ethoxy group (—OCH$_2$CH$_3$), and propoxy group (—OCH$_2$CH$_2$CH$_3$).

(C) Materials represented by chemical formulae C1 and C2 indicated in FIG. 7A and FIG. 7B.

In chemical formulae C1 and C2, each of $X^1$ and $X^2$ independently indicate either of hydroxy group (—OH), carboxyl group (—COOH), amino group (—NH$_2$), amide group (—CONH$_2$), nitro group (—NO$_2$), methylester group (—COO—CH$_3$), methoxy group (—OCH$_3$), ethoxy group (—OCH$_2$CH$_3$), and propoxy group (—OCH$_2$CH$_2$CH$_3$).

(D) Materials represented by chemical formulae D1 and D2 indicated in FIG. 8A and FIG. 8B.

In chemical formulae D1 and D2, each of $X^1$, $X^2$, $X^3$, and $X^4$ independently indicate either of hydroxy group (—OH), carboxyl group (—COOH), amino group (—NH$_2$), amide group (—CONH$_2$), nitro group (—NO$_2$), methylester group (—COO—CH$_3$), methoxy group (—OCH$_3$), ethoxy group (—OCH$_2$CH$_3$), propoxy group (—OCH$_2$CH$_2$CH$_3$), and R indicates either of carbonyl group (—CO—), peptide bond (—CONH—), ester bond (—COO—), ether bond (—O—), (—NHNHO—) bond, (—COCOO—) bond, and (—CHCH—) bond.

Sublimate 74 may further include materials indicated in FIG. 9, FIG. 10, FIG. 11, FIG. 12, FIG. 13, FIG. 14, and FIG. 15.

The materials indicated in FIG. 9 are examples of materials corresponding to formulae A1 to A4.

The materials indicated in FIG. 10 are examples of materials corresponding to formulae B1 and B2.

The material indicated in FIG. 11 is an example of a material corresponding to formula B3.

The material indicated in FIG. 12 is an example of a material corresponding to formula B4.

The material indicated in FIG. 13 is an example of a material corresponding to formula B5.

The materials indicated in FIG. 14 are examples of materials corresponding to formulae C1 and C2.

The materials indicated in FIG. 15 are examples of materials corresponding to formulae D1 and D2.

Figure 4C:
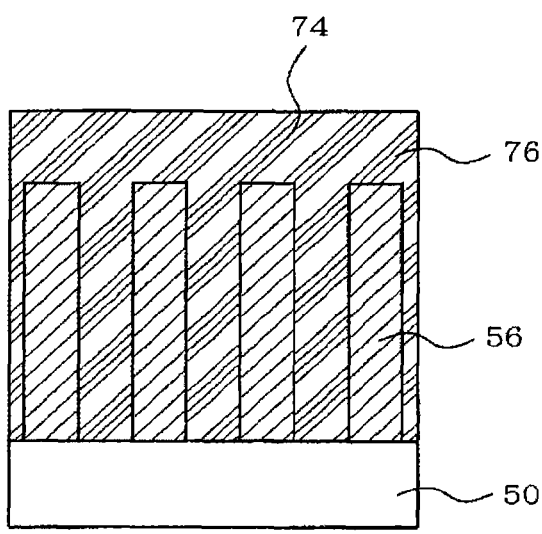

Next, as illustrated in FIG. 3 and FIG. 4C, solvent is vaporized from solution 72 attached to semiconductor substrate 50 to precipitate sublimate 74 to semiconductor substrate 50 (S23). The precipitate of sublimate 74 solidifies as a solid precipitate 76. The solidified precipitate 76 fills the spaces between structures 56 formed in semiconductor substrate 50 and thus, provides support to the adjacent structures 56. As a result, it is possible to inhibit collapse of structures 56.

Figure 4D:
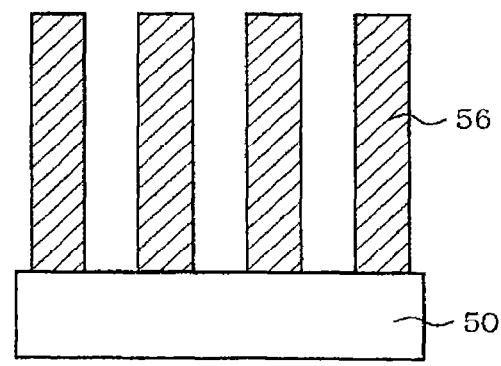

Next, as illustrated in FIG. 3 and FIG. 4D, precipitate 76 (sublimate 74) is sublimated (S24). Precipitate 76 exhibits sublimating properties at specific temperatures and pressures and transforms from the solid state (solid phase) to the gas state (gas phase) without experiencing the liquid state (liquid phase). It is possible to remove precipitate 76 from semiconductor substrate 50 by discharging the gaseous precipitate 76 (sublimate 74). For example, sublimate 74 is preferably sublimated at a temperature lower than the melting point of sublimate 74 and at a pressure equal to or lower than 10 kPa.

As described above, precipitate 76 can be removed by sublimation and thus, precipitate 76 does not experience the liquid state during the drying step. Thus, structures 56 are not pulled by the liquid surface tension while precipitate 76 is being removed, in other words, during the drying step. Further, the solid precipitate 76 fills the spaces between structures 56 and supports structures 56. Thus, precipitate 76 provides support to structures 56 until it is removed and inhibits collapse of structures 56. The drying step of the present embodiment is ended (S14) when removal of precipitate 76 (sublimate 74) by sublimation is completed. Processes such as plasma irradiation, ozone exposure, excimer UV radiation, or the like may follow the removal of precipitate 76 by sublimation.

The above described process steps substitutes the liquid attached to semiconductor substrate 50 as the result of liquid treatment with a solution containing a sublimate, whereafter precipitate 76 (sublimate 74) is precipitated and subsequently sublimated. As a result, it is possible to remove precipitate 76, in other words, carry out the drying process without experiencing the liquid state. Thus, it is possible to dry the liquid treated semiconductor substrate 50 while preventing collapse of structures 56. It is thus, possible to provide a method of manufacturing a semiconductor device in which a liquid treated semiconductor substrate having fine patterns formed therein can be dried while inhibiting pattern collapse.

(Selection of Sublimate)

The inventors have made the following considerations and the conducted the following experiment in selecting sublimate 74.

Candidates of sublimate 74 were selected from materials that: have a melting point ranging from 15 to 200 degrees Celsius, have a boiling point ranging from 80 to 300 degrees Celsius, have a molecular weight ranging from 10 to 300, do not contain halogens, and are not poisonous materials.

As described above, examples of sublimates given in the present embodiment indicate organic materials having a vapor pressure of 5 Pa or less at room temperature and sublimating from solid to gas by depressurization and/or heating.

Next, a solution was prepared by dissolving the materials selected from the above described standpoint into IPA. The solution was coated over the semiconductor substrate having a line-and-space pattern structure formed therein and evaluation was made on film-formability. This was followed by sublimate precipitation and the precipitated sublimate was removed by sublimation. Then, evaluation was made on the collapse rate of the patterned structure.

Good results were obtained for the materials indicated in FIG. 9 to FIG. 15 referenced above as the result of this experiment. For example, good film formability as well as improvement in collapse resistance (reduced collapse rate) was observed in the materials indicated in FIG. 9 to FIG. 15 referenced above.

Further, the inventors have learned the following based on the result of the experiment.

For example, in the basic structure of the cyclohexane ring indicated in FIG. 9, good film formability and improved collapse resistance were observed in materials (cyclohexane-1,2-dicarboxylic acid, cyclohexane-1,3-dicarboxylic acid, and cyclohexane-1,4-dicarboxylic acid) in which a carboxyl group (—COOH) was bonded in the 1,2 position; the 1,3 position; or the 1,4 position. In other words, good film formability and improved collapse resistance were observed in materials in which two carboxyl groups bonded to a cyclohexane ring. Further, good film formability and improved collapse resistance were observed in a material (cyclohexane-1,2,4-tricarboxylic acid) in which a carboxyl group was bonded in the 1,2,4 position of a cyclohexane ring indicated in FIG. 9. To summarize, in the basic structure of a cyclohexane ring, good film formability and improved collapse resistance were observed in materials in which a carboxyl group (—COOH) was bonded in the 1,2 position; the 1,3 position; the 1,4 position; or the 1,2,4 position.

In the disubstituted materials of benzene indicated in FIG. 10, good film formability and improved collapse resistance were observed in materials (phtalic acid and aminoacetphenone) in which a carboxyl group or an amino group (—NH$_2$) was bonded in the ortho position or the meta position.

In the trisubstituted materials of benzene indicated in FIG. 11, good film formability and improved collapse resistance were observed in materials (barinin, 4-hydroxyphtalic acid, trimellitic acid, and dimethoxyacetphenone) in which a carboxyl group, hydroxy group (—OH) or a methoxy group (—O—CH$_3$) was bonded in the 1,2,4 position. Further, among the trisubstituted materials of benzene, good film formability and improved collapse resistance were also observed in an anhydride (trimellitic anhydride) obtained by dehydrating a carboxyl group in the 1,2 position from a material (trimellitic acid) in which a carboxyl group was bonded in the 1,2,4 position.

In the trisubstituted materials of benzene indicated in FIG. 12, good film formability and improved collapse resistance were observed in a material (5-hydroxyisophtalic acid) in which a carboxyl group or a hydroxy group was bonded in the 1,3,5 position.

In the tetrasubstituted materials of benzene indicated in FIG. 13, good film formability and improved collapse resistance were observed in materials in which a carboxyl group, hydroxy group, or methylester group (—COO—$CH_3$) was bonded in the 1,3,4,5 position. Good film formability and improved collapse resistance were observed especially in materials (gallic acid, gallic acid methyl) in which hydroxy group was bonded in the 3,4,5 position and a carboxyl group or a methylester group was bonded in the 1-position.

In the disubstituted materials of naphthalene indicated in FIG. 14, good film formability and improved collapse resistance were observed in materials in which two hydroxy groups were bonded. Good film formability and improved collapse resistance were observed especially in a material (1,7-dihydronaphthalene) in which a hydroxy group was bonded in the 1,7-position.

In the disubstituted materials of benzophenone indicated in FIG. 15, good film formability and improved collapse resistance were observed in a material (4,4'-dihydroxybenzophenone) in which a hydroxy group was bonded in the 4,4'-position. Further, in the tetrasubstituted materials of benzophenone, good film formability and improved collapse resistance were observed in a material (2,2',4,4'-tetrahydroxybenzophenone) in which a hydroxy group was bonded in the 2,2',4,4'-position.

Based on the insights obtained from the results of experiments conducted in the above described manner, the inventors have conceived of the effectiveness of a substituent group having polarity. For example, a silicon-based film has a native oxide film formed on its surface. An OH group exists on the surface of a native oxide film. A material having a functional group (substituent group) capable of interacting with an OH group is presumed to exhibit good film formability. Thus, the inventors have conceived that it is preferable to use a material having either a hydroxy group (—OH), carboxyl group (—COOH), amino group (—$NH_2$), amide group (—$CONH_2$), nitro group (—$NO_2$), methylester group (—COO—$CH_3$), methoxy group (—$OCH_3$), ethoxy group (—$OCH_2CH_3$), and a propoxy group (—$OCH_2CH_2CH_3$) as a substituent group. The inventors have further conceived that it is especially preferable to use a material having a hydroxy group or a carboxyl group.

Still further, the inventors have conceived that it is preferable to us a material having either of carbonyl group (—CO—), amide group (—$CONH_2$—), ester bond (—COO—) (—NHNHO—) bond, ether bond (—O—), (—COCOO—) bond, and (—CHCH—) bond in the bonding site of two benzene rings in a benzophenone.

The generalized formulae A1 to A4, B1 to B5, C1, C2, D1, and D2 described earlier have been obtained from the insights and conceptions described above.

Other Embodiments

The embodiment described above may be applied to a NAND or a NOR-type flash memory, EPROM, DRAM, SRAM, other types of semiconductor storage devices, or various types of logic devices, and to manufacturing process steps of other types of semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
   attaching, by a liquid treatment, a first liquid to a surface of a semiconductor substrate having a fine pattern formed therein;
   substituting the first liquid attached to the surface of the semiconductor substrate with a solution, the solution comprising a sublimate dissolved in a second liquid;
   vaporizing the second liquid and precipitating the sublimate to the surface of the semiconductor substrate to form a solid precipitate comprising the sublimate; and
   removing the precipitate by sublimation,
   the sublimate comprising at least one material selected from a group consisting of:
   materials represented by chemical formulae A1, A2, A3, and A4 indicated in FIG. 5A, FIG. 5B, FIG. 5C, and FIG. 5D where $X^1$, $X^2$, and $X^3$ in the chemical formulae A1, A2, A3, and A4 each independently represent either of a hydroxy group (—OH), a carboxyl group (—COOH), an amino group (—$NH_2$), an amide group (—$CONH_2$), a nitro group (—$NO_2$), and a methylester group (—COO—$CH_3$),
   materials represented by chemical formulae B1, B2, B3, B4, and B5 indicated in FIG. 6A, FIG. 6B, FIG. 6C, FIG. 6D, and FIG. 6E where $X^1$, $X^2$, $X^3$, and $X^4$ in the chemical formulae B1, B2, B3, B4 and B5 each independently represent either of a hydroxy group (—OH), a carboxyl group (—COOH), an amino group (—$NH_2$), an amide group (—$CONH_2$), a nitro group (—$NO_2$), a methylester group (—COO—$CH_3$), a methoxy group (—$OCH_3$), an ethoxy group (—$OCH_2CH_3$), and a propoxy group (—$OCH_2CH_2CH_3$),
   materials represented by chemical formulae C1 and C2 indicated in FIG. 7A and FIG. 7B where $X^1$ and $X^2$ in the chemical formulae C1 and C2 each independently represent either of a hydroxy group (—OH), a carboxyl group (—COOH), an amino group (—$NH_2$), an amide group (—$CONH_2$), a nitro group (—$NO_2$), a methylester group (—COO—$CH_3$), a methoxy group (—$OCH_3$), an ethoxy group (—$OCH_2CH_3$), and a propoxy group (—$OCH_2CH_2CH_3$), and
   materials represented by chemical formulae D1 and D2 indicated in FIG. 8A and FIG. 8B where $X^1$, $X^2$, $X^3$, and $X^4$ in the chemical formulae D1 and D2 each independently represent either of a hydroxy group (—OH), a carboxyl group (—COOH), an amino group (—$NH_2$), an amide group (—$CONH_2$), a nitro group (—$NO_2$), a methylester group (—COO—$CH_3$), a methoxy group (—$OCH_3$), an ethoxy group (—$OCH_2CH_3$), and a propoxy group (—$OCH_2CH_2CH_3$) and where R in the chemical formulae D1 and D2 represent either of a carbonyl group (—CO—), a peptide bond (—CONH—), an ester bond (—COO—), an ether bond (—O—), (—NHNHO—) bond, (—COCOO—) bond, and a (—CHCH—) bond.

2. The method according to claim 1, wherein the sublimate comprises a material having at least two carboxyl groups bonded to cyclohexane.

3. The method according to claim 1, wherein the sublimate comprises two carboxyl groups bonded to benzene, bonding sites of the two carboxyl groups being adjacent to one another.

4. The method according to claim 1, wherein $X^1$, $X^2$, $X^3$, and $X^4$ in the chemical formulae A1, A2, A3, A4, B1, B2, B3, B4, B5, C1, C2, D1 and D2 each independently represent a hydroxy group or a carboxyl group.

5. The method according to claim 1, wherein the chemical formula A1 represents cyclohexane-1,2-dicarboxylic acid, the chemical formula A2 represents cyclohexane-1,3-dicarboxylic acid, the chemical formula A3 represents cyclohexane-1,4-dicarboxylic acid, and the chemical formula A4 represents cyclohexane-1,2,4-tricarboxylic acid.

6. The method according to claim 1, wherein the chemical formula B1 represents phtalic acid and the chemical formula B2 represents aminoacetphenone.

7. The method according to claim 1, wherein the chemical formula B3 represents a material including either of barinin, 4-hydroxyphtalic acid, trimellitic acid, trimellitic anhydride, and dimethoxyacetphenone.

8. The method according to claim 1, wherein the chemical formula B4 represents 5-hydroxyisophtalic acid.

9. The method according to claim 1, wherein the chemical formula B5 represents a material including either gallic acid or gallic acid methyl.

10. The method according to claim 1, wherein the chemical formula C1 or C2 represents 1,7-dihydronaphthalene.

11. The method according to claim 1, wherein the chemical formula D1 represents 4,4'-dihydroxybenzophenone and the chemical formula D2 represents 2,2',4,4'-tetrahydroxybenzophenone.

12. The method according to claim 1, wherein the first liquid comprises at least one material selected from a group consisting of water, aliphatic hydrocarbon, aromatic hydrocarbon, esters, ketones, alcohols and ethers, polyalcohols, and pyrrolidone solvent.

13. The method according to claim 1, wherein the second liquid comprises at least one material selected from a group consisting of aliphatic hydrocarbon, aromatic hydrocarbon, esters, ketones, alcohols and ethers, polyalcohols, and pyrrolidone solvent.

14. The method according to claim 1, wherein the second liquid comprises at least one material selected from a group consisting of water, methanol, ethanol, IPA (isopropyl alcohol), butanol, propanol, ethylene glycol, propylene glycol, NMP (N-methyl-2-pyrrolidone), DMF (N,N-dimethyformamide), DMA (N,N-dimethylacetamide) and DMSO (dimethylsulfoxide), hexane, toluene, propyleneglycol monomethylether acetate (PGMEA), propyleneglycol monomethylether (PGME), propyleneglycol monopropylether (PGPE), propyleneglycol monoethylether (PGEE), gamma butyrolactone (GBL), acetylacetone, 3-pentanone, 2-pentanone, ethyl lactate, cyclohexanone, dibutylether, hydrofluoroether (HFE), ethyl nonafluoroisobutyl ether, ethyl nonafluorobutyl ether, m-xylenehexafluoride, cyclohexane, formic acid, acetic acid, pyridine, diethylamine, dimethylamine, ethylenediamine, triethylamine, dimethylacetamide, diethylacetamide, and formamide.

15. A method of manufacturing a semiconductor device comprising:
attaching, by a liquid treatment, a first liquid to a surface of a semiconductor substrate having a fine pattern formed therein;
substituting the first liquid attached to the surface of the semiconductor substrate with a third liquid, the third liquid having an affinity for the first liquid;
substituting the third liquid with a solution, the solution comprising a sublimate dissolved in a second liquid, the second liquid having an affinity for the third liquid;
vaporizing the second liquid and precipitating the sublimate to the surface of the semiconductor substrate to form a solid precipitate comprising the sublimate; and
removing the precipitate by sublimation,
the sublimate comprising at least one material selected from a group consisting of:
materials represented by chemical formulae A1, A2, A3, and A4 indicated in FIG. 5A, FIG. 5B, FIG. 5C, and FIG. 5D where $X^1$, $X^2$, and $X^3$ in the chemical formulae A1, A2, A3, and A4 each independently represent either of a hydroxy group (—OH), a carboxyl group (—COOH), an amino group (—NH$_2$), an amide group (—CONH$_2$), a nitro group (—NO$_2$) and a methylester group (—COO—CH$_3$),
materials represented by chemical formulae B1, B2, B3, B4, and B5 indicated in FIG. 6A, FIG. 6B, FIG. 6C, FIG. 6D, and FIG. 6E where $X^1$, $X^2$, $X^3$, and $X^4$ in the chemical formulae B1, B2, B3, B4 and B5 each independently represent either of a hydroxy group (—OH), a carboxyl group (—COOH), an amino group (—NH$_2$), an amide group (—CONH$_2$), a nitro group (—NO$_2$), a methylester group (—COO—CH$_3$), a methoxy group, an ethoxy group, and a propoxy group,
materials represented by chemical formulae C1 and C2 indicated in FIG. 7A and FIG. 7B where $X^1$ and $X^2$ in the chemical formulae C1 and C2 each independently represent either of a hydroxy group (—OH), a carboxyl group (—COOH), an amino group (—NH$_2$), an amide group (—CONH$_2$), a nitro group (—NO$_2$), a methylester group (—COO—CH$_3$), a methoxy group (—OCH$_3$), an ethoxy group (—OCH$_2$CH$_3$), and a propoxy group (—OCH$_2$CH$_2$CH$_3$), and
materials represented by chemical formulae D1 and D2 indicated in FIG. 8A and FIG. 8B where $X^1$, $X^2$, $X^3$, and $X^4$ in the chemical formulae D1 and D2 each independently represent either of a hydroxy group (—OH), a carboxyl group (—COOH), an amino group (—NH$_2$), an amide group (—CONH$_2$), a nitro group (—NO$_2$), a methylester group (—COO—CH$_3$), a methoxy group (—OCH$_3$), an ethoxy group (—OCH$_2$CH$_3$) and a propoxy group (—OCH$_2$CH$_2$CH$_3$) and where R in the chemical formulae D1 and D2 represent either of a carbonyl group (—CO—), a peptide bond (—CONH—), an ester bond (—COO—), an ether bond (—O—), (—NHNHO—) bond, (—COCOO—) bond, and a (—CHCH—) bond.

16. The method according to claim 15, wherein the sublimate comprises a material having at least two carboxyl groups bonded to cyclohexane.

17. The method according to claim 15, wherein the sublimate comprises two carboxyl groups bonded to benzene, bonding sites of the two carboxyl groups being adjacent to one another.

18. The method according to claim 15, wherein $X^1$, $X^2$, $X^3$, and $X^4$ in the chemical formulae A1, A2, A3, A4, B1, B2, B3, B4, B5, C1, C2, D1 and D2 each independently represent a hydroxy group or a carboxyl group.

19. The method according to claim 15, wherein the second liquid comprises at least one material selected from a group consisting of aliphatic hydrocarbon, aromatic hydrocarbon, esters, ketones, alcohols and ethers, polyalcohols, and pyrrolidone solvent.

20. The method according to claim 15, wherein the second liquid comprises at least one material selected from a group consisting of water, methanol, ethanol, IPA (isopropyl alcohol), butanol, propanol, ethylene glycol, propylene glycol, NMP (N-methyl-2-pyrrolidone), DMF (N,N-dimethyformamide), DMA (N,N-dimethylacetamide) and DMSO (dimethylsulfoxide), hexane, toluene, propyleneglycol monomethylether acetate (PGMEA), propyleneglycol monomethylether (PGME), propyleneglycol monopropylether (PGPE), propyleneglycol monoethylether (PGEE), gamma butyrolactone (GBL), acetylacetone, 3-pentanone, 2-pentanone, ethyl lactate, cyclohexanone, dibutylether, hydrofluoroether (HFE), ethyl nonafluoroisobutyl ether, ethyl nonafluorobutyl ether, m-xylenehexafluoride, cyclohexane, formic acid, acetic acid, pyridine, diethylamine, dimethylamine, ethylenediamine, triethylamine, dimethylacetamide, diethylacetamide, and formamide.

* * * * *